(12) United States Patent
Gharpurey

(10) Patent No.: US 6,400,224 B2
(45) Date of Patent: Jun. 4, 2002

(54) TWO STAGE LOW NOISE AMPLIFIER

(75) Inventor: Ranjit Gharpurey, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 09/770,335

(22) Filed: Jan. 26, 2001

Related U.S. Application Data

(60) Provisional application No. 60/179,313, filed on Jan. 31, 2000.

(51) Int. Cl.[7] .................................................. H03F 3/45
(52) U.S. Cl. ........................ 330/252; 330/301; 330/305
(58) Field of Search ................................ 330/252, 253, 330/261, 301, 305, 311; 455/323, 302, 332, 208, 209

(56) References Cited

U.S. PATENT DOCUMENTS 5,563,545 A * 10/1996 Scheinberg .................. 327/389
5,974,306 A * 10/1999 Hornak et al. ............... 455/323

* cited by examiner

*Primary Examiner*—Robert Pascal
*Assistant Examiner*—Henry Choe
(74) *Attorney, Agent, or Firm*—Ronald O. Neerings; Wade James Brady, III; Frederick J. Telecky, Jr.

(57) ABSTRACT

A two stage low noise amplifier (10) includes a first stage (12) and a second stage (14). The first stage (12) receives an input signal ($V_{IN}$), performs single to differential conversion on the input signal ($V_{IN}$), and generates an input differential signal ($V_A$ and $V_B$) therefrom. A bias level of the input differential signal ($V_A$ and $V_B$) may be adjusted to an optimal bias point of the second stage (14). The first stage (12) provides the input differential signal ($V_A$ and $V_B$) to the second stage (14) And provides image rejection without any loss in amplifier gain. The second stage (14) performs image rejection on the input differential signal ($V_A$ and $V_B$) and generates an output differential signal ($V_+$ and $V_-$) therefrom. The first stage (12) and stage (14) include a tuning circuit to adjust a center operating frequency of the amplifier (10). The first stage (12) and the second stage (14) receive control signals from a control bus (16) in order to adjust the center operating frequency.

20 Claims, 1 Drawing Sheet

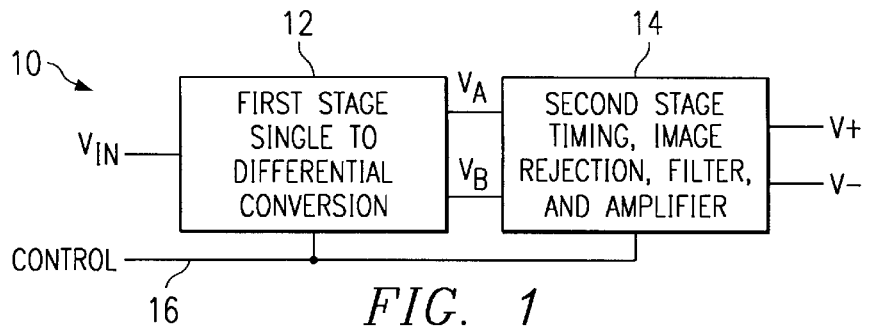
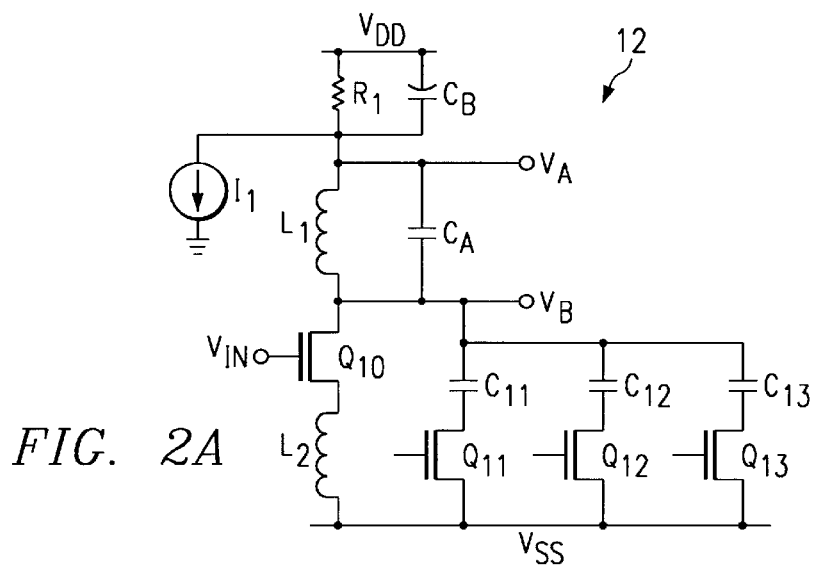
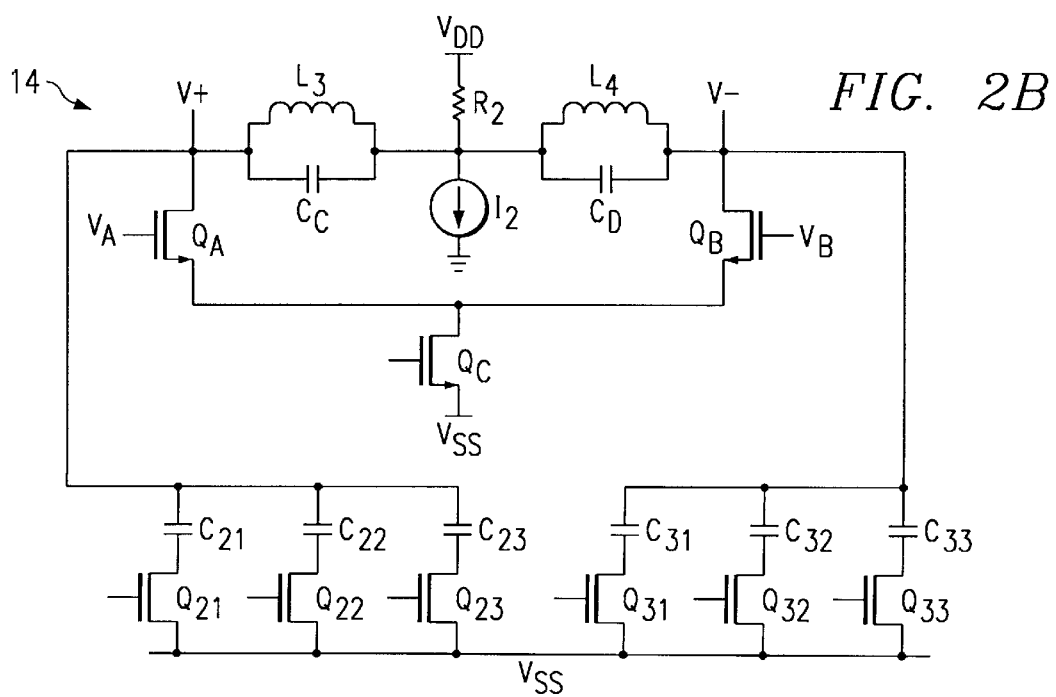

TWO STAGE LOW NOISE AMPLIFIER

This application claims priority under 35 U.S.C. §119(e)(1) of provisional application Ser. No. 60/179,313, filed on Jan. 31, 2000, the entirety of which is incorporated herein by reference.

TECHNICAL FIELD OF THE INVENTION

The present invention relates in general to radio frequency receiver technology and more particularly to a two stage low noise amplifier.

BACKGROUND OF THE INVENTION

In radio frequency receiver topologies, radio frequency filters provide outputs which are single ended. However, typical receiver implementations require differential signals in order to take advantage of isolation benefits. In order to obtain differential signals though, current radio receiver implementations use off chip balun circuits which increases the cost for the receiver. Also, effective receivers need to have frequency trimming and image rejection capabilities. Therefore, it is desirable to have a receiver circuit that can provide the necessary capabilities in a more effective manner.

SUMMARY OF THE INVENTION

From the foregoing, it may be appreciated by those skilled in the art that a need has arisen for a receiver circuit that can perform single to differential conversion with frequency tuning and image rejection functions. In accordance with the present invention, a two stage low noise amplifier circuit is provided that substantially eliminates or reduces disadvantages and problems associated with conventional receiver implementations.

According to an embodiment of the present invention, there is provided a two stage low noise amplifier that includes a first stage performing single to differential conversion of an input signal. Since the load is tuned, some image rejection is achieved in the first stage. A second stage receives a differential signal from the first stage. The second stage performs differential tuning of a center operating frequency in order to provide image rejection of the differential signal.

The present invention provides various technical advantages over conventional receiver implementations. For example, one technical advantage is to provide single to differential conversion, frequency tuning, and image rejection in an amplifier circuit design on a single semiconductor device. Another technical advantage is to eliminate a need for A.C. coupling and D.C. bias level shifting between stages of an amplifier circuit design. Yet another technical advantage is to provide single to differential conversion without a loss in amplifier gain. Other technical advantages may be readily apparent to those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIG. 1 illustrates a block diagram of a two stage low noise amplifier;

FIGS. 2A–B illustrate circuit diagrams of the two stage low noise amplifier.

DETAILED DESCRIPTION OF THE INVENTION

FIG. 1 is a block diagram of a two stage low noise amplifier 10. Amplifier 10 includes a first stage 12 and a second stage 14. First stage 12 receives an input signal $V_{IN}$. First stage 12 converts the single ended input signal $V_{IN}$ to a differential signal $V_A$ and $V_B$. Second stage 14 receives the differential signal $V_A$ and $V_B$ from first stage 12. Second stage 14 performs image rejection on the differential signal $V_A$ and $V_B$ and generates a differential output $V_+$ and $V_-$. Since the first stage is tuned, some image rejection is achieved in the first stage as well. First stage 12 and second stage 14 each receive control signals over a control bus 16 to provide a tuning capability for a center operating frequency of amplifier 10.

FIGS. 2A–C show a simplified circuit implementation for amplifier 10. FIG. 2A shows the circuit implementation of first stage 12. First stage 12 receives input signal $V_{IN}$ at transistor $Q_{10}$. Single to differential conversion occurs through the generation of $V_A$ and $V_B$ that is presented to second stage 14. Since inductor $L_1$ is a short at D.C., the D.C. bias level or common mode level for second stage 14 is identical at $V_A$ and $V_B$. The D.C. bias level can be varied within first stage 12 by varying the drop across resistor $R_2$ in response to adjusting the current level through current source $I_1$. In this manner, the D.C. bias level can be placed at an optimal bias point for second stage 14.

FIG. 2B shows the circuit implementation for second stage 14. The differential signal $V_A$ and $V_B$ is passed to second stage 14 without any loss in amplifier gain. This is accomplished by eliminating any A.C. coupling between first stage 12 and second stage 14 and the use of D.C. bias level shifters there between. A.C. coupling include capacitors that cause a gain loss due to bottom plate parasitics. D.C. bias level shifters require a source follower that also results in a loss in amplifier gain. First stage 12 and Second stage 14 performs image rejection at a first image frequency by about 20 db for typical heterodyne applications, especially at a center operating frequency of 1.9 GHz with a local oscillator of 1.6 GHz to place the image at 1.3 GHz. FIG. 2C shows how the center operating frequency can be tuned by switching on or off transistors Q21, Q22, Q23, Q31, Q32, and Q33 in order to activate capacitors $C_{21}$, $C_{22}$, $C_{23}$, $C_{31}$, $C_{32}$, and $C_{33}$, respectively, within the circuit.

Amplifier 10 operates with low power consumption that is beneficial for use in radio frequency topologies. Single to differential conversion is achieved on chip without any loss in gain. A voltage developed across a tuned load at radio frequencies is used to drive a differential stage. Image rejection is provided through the two stage structure. Also, amplifier 10 uses two tank circuits tuned to the same frequency.

Thus, it is apparent that there has been provided, in accordance with the present invention, a low noise amplifier that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A two stage low noise amplifier, comprising:
   a first stage operable to perform single to differential conversion of an input signal; and providing image rejection a second stage operable to receive a differential signal from the first stage, the second stage operable to perform differential tuning of a center operating frequency in order to provide image rejection of the differential signal.

2. The amplifier of claim 1, wherein the first and second stages operate on a single integrated circuit.

3. The amplifier of claim 1, wherein the first stage performs single to differential conversion without a loss in gain.

4. The amplifier of claim 1, wherein image rejection of about 20 db occurs at a first image frequency.

5. The amplifier of claim 1, wherein the first stage is operable to adjust an input bias level of the differential signal presented to the second stage.

6. The amplifier of claim 5, wherein the second stage is operable to set an output bias level independently of the input bias level.

7. The amplifier of claim 1, wherein the second stage is operable to generate an output differential signal associated with the input signal.

8. The amplifier of claim 1, wherein the first stage presents the differential signal to the second stage without any A.C. coupling.

9. The amplifier of claim 1, wherein the first stage presents the differential signal to the second stage without any D.C. bias level shifting.

10. The amplifier of claim 1, wherein the first stage provides the differential signal at the optimal bias point of the second stage.

11. A two stage low noise amplifier, comprising:

a first stage operable to perform single to differential conversion of an input signal, the first stage operable to generate an input differential signal from the input signal, the first stage including a first tuning circuit operable to adjust a center operating frequency of the amplifier, the first tuning circuit operable to receive control signals to adjust the center operating frequency, the first stage operable to vary a bias level of the input differential signal the first stage capable of providing image rejection;

a second stage operable to receive the input differential signal from the first stage, the second stage operable to perform image rejection on the input differential signal, the second stage including a second tuning circuit operable to adjust the center operating frequency, the first tuning circuit operable to receive the control signals to adjust the center operating frequency, the second stage operable to generate an output differential signal.

12. The amplifier of claim 11, wherein the first and second tuning circuits include a series of transistors operable to activate corresponding transistors in response to the control signals.

13. The amplifier of claim 11, wherein the second stage includes a current source operable to adjust a bias level of the output differential signal independent of a bias level of the input differential signal.

14. The amplifier of claim 11, wherein the first stage provides the input differential signal to the second stage without any loss in amplifier gain.

15. The amplifier of claim 11, wherein the first and second stages include tank circuits tuned to a same frequency.

16. A method of generating a differential signal, comprising:

receiving an input signal;

converting the input signal into an input differential signal;

performing image rejection on the input differential signal;

generating an output differential signal in response to the input differential signal;

adjusting a center operating frequency associated with the input and output differential signals.

17. The method of claim 16, further comprising:

varying a bias level of the input differential signal.

18. The method of claim 17 further comprising:

varying a bias level of the output differential signal independently of the bias level of the input differential signal.

19. The method of claim 17, wherein the bias level of the input differential signal is varied to an optimal bias point of the second stage.

20. The method of claim 16, wherein the first stage provides the input differential signal to the second stage without any loss in amplifier gain.

* * * * *